(12) United States Patent
Fischbach et al.

(10) Patent No.: US 6,804,121 B2
(45) Date of Patent: Oct. 12, 2004

(54) HOUSING FOR BIOMETRIC SENSOR CHIPS AND METHOD FOR PRODUCING THE HOUSING

(75) Inventors: Reinhard Fischbach, München (DE); Manfred Fries, Hunderdorf (DE)

(73) Assignee: Infineon Technologies AG, Munich (DE)

(*) Notice: Subject to any disclaimer, the term of this patent is extended or adjusted under 35 U.S.C. 154(b) by 21 days.

(21) Appl. No.: 10/253,175

(22) Filed: Sep. 24, 2002

(65) Prior Publication Data

US 2003/0063445 A1 Apr. 3, 2003

Related U.S. Application Data

(63) Continuation of application No. PCT/DE01/01095, filed on Mar. 22, 2001.

(30) Foreign Application Priority Data

Mar. 24, 2000 (EP) .............................................. 00106473

(51) Int. Cl.[7] .................................................. H05K 5/06
(52) U.S. Cl. ........................ 361/752; 361/800; 361/797; 257/90
(58) Field of Search ................................ 361/752, 797, 361/724, 816, 800, 730, 760; 348/836; 257/90

(56) References Cited

U.S. PATENT DOCUMENTS

| | | | | |
|---|---|---|---|---|
| 5,811,799 A | * | 9/1998 | Wu ............................. | 250/239 |
| 5,864,470 A | * | 1/1999 | Shim et al. ................. | 361/777 |
| 6,028,773 A | * | 2/2000 | Hundt ......................... | 361/760 |
| 6,475,832 B2 | * | 11/2002 | Crane et al. ................ | 438/116 |

FOREIGN PATENT DOCUMENTS

| | | |
|---|---|---|
| DE | 198 31 570 A1 | 1/2000 |
| EP | 0 057 253 B1 | 8/1982 |
| EP | 0 789 334 B1 | 8/1997 |
| WO | WO 99/60513 | 11/1999 |

* cited by examiner

*Primary Examiner*—Randy W. Gibson
*Assistant Examiner*—Hung Bui
(74) *Attorney, Agent, or Firm*—Laurence A. Greenberg; Werner H. Stemer; Ralph E. Locher

(57) ABSTRACT

A housing for biometric sensor chips and a method for producing such a housing includes a freely accessible fingerprint checking area on a sensor chip, a mount substrate with contact outer surfaces thereon, the mount substrate being a mounting strip with perforated edges, on which the contact outer surfaces are disposed partially outside a housing frame, and the sensor chip is positioned within the housing frame.

20 Claims, 6 Drawing Sheets

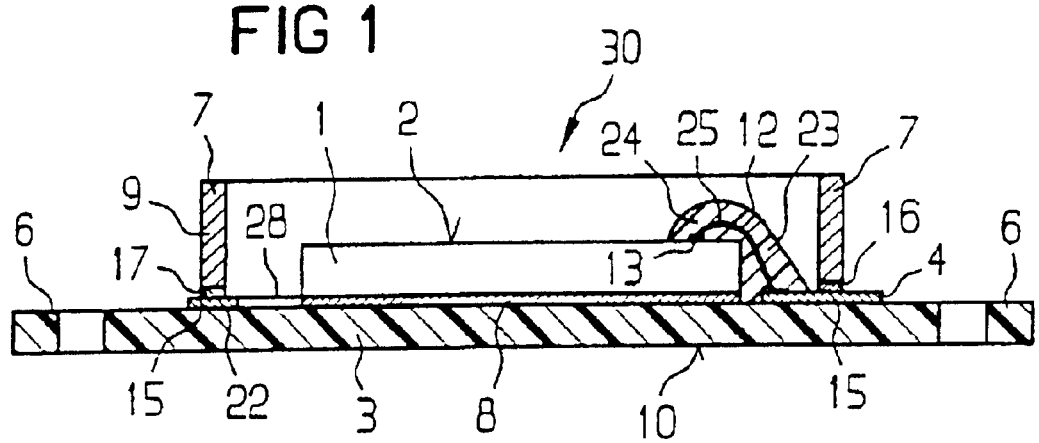
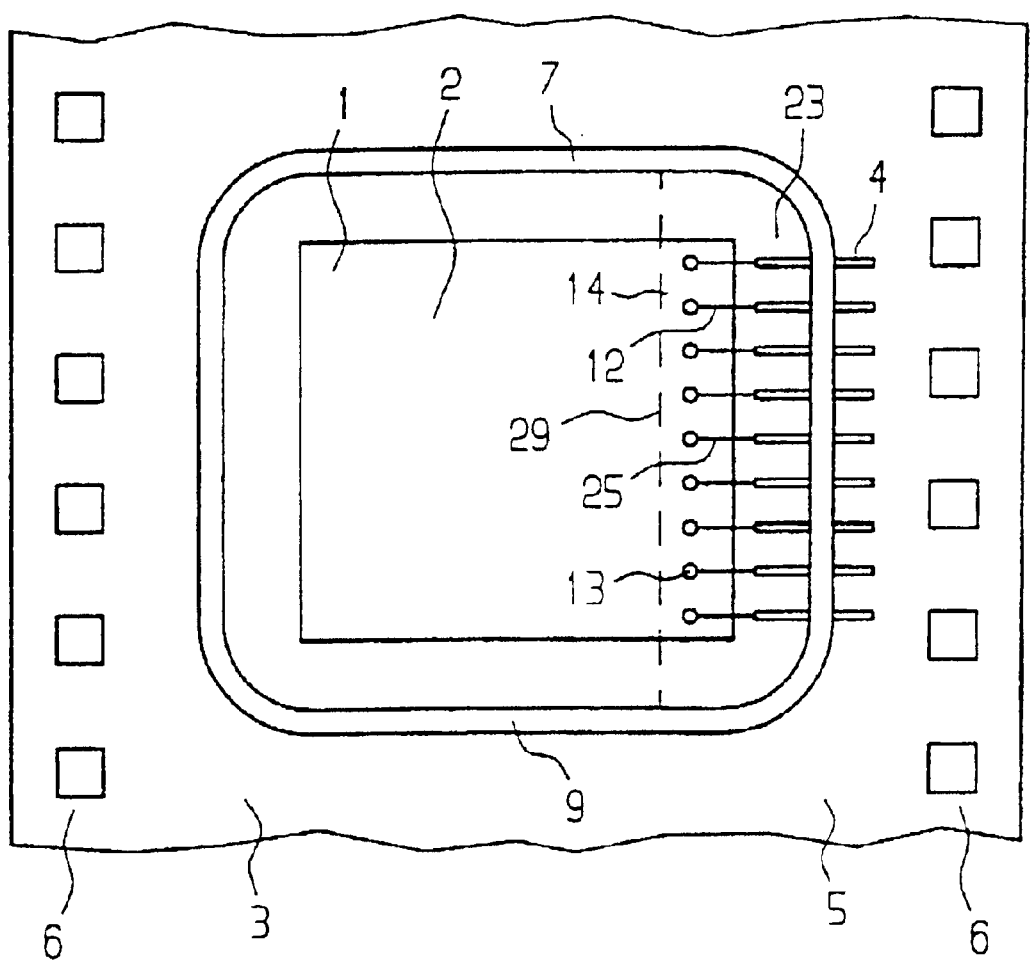

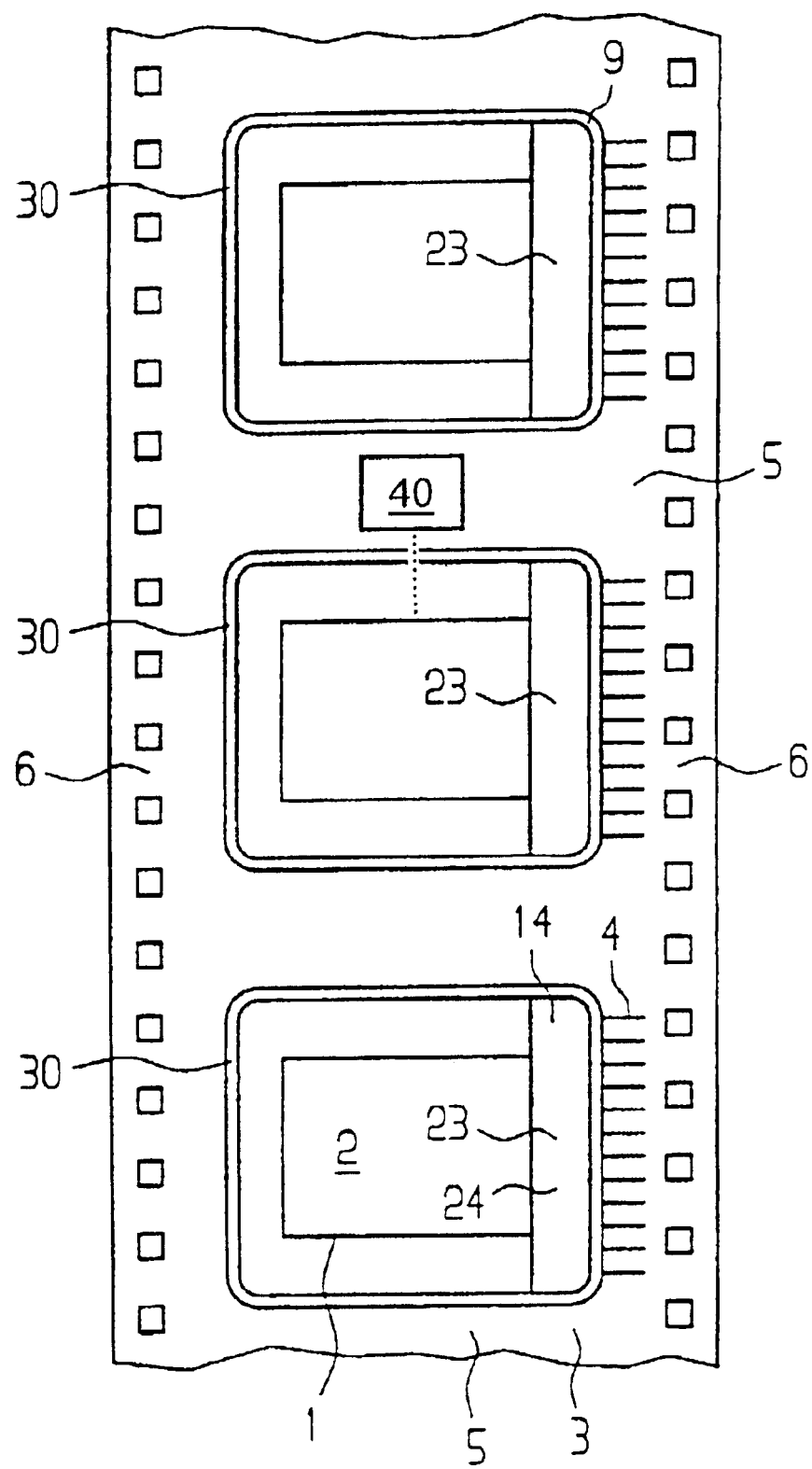

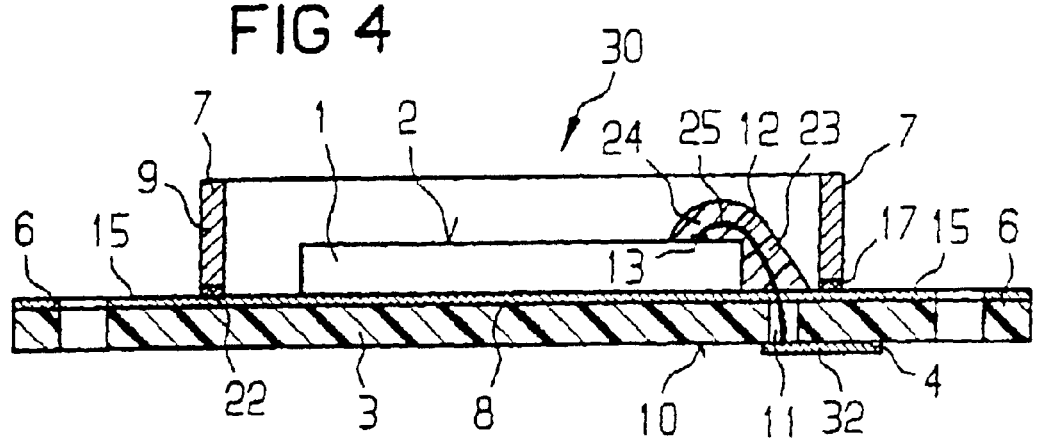
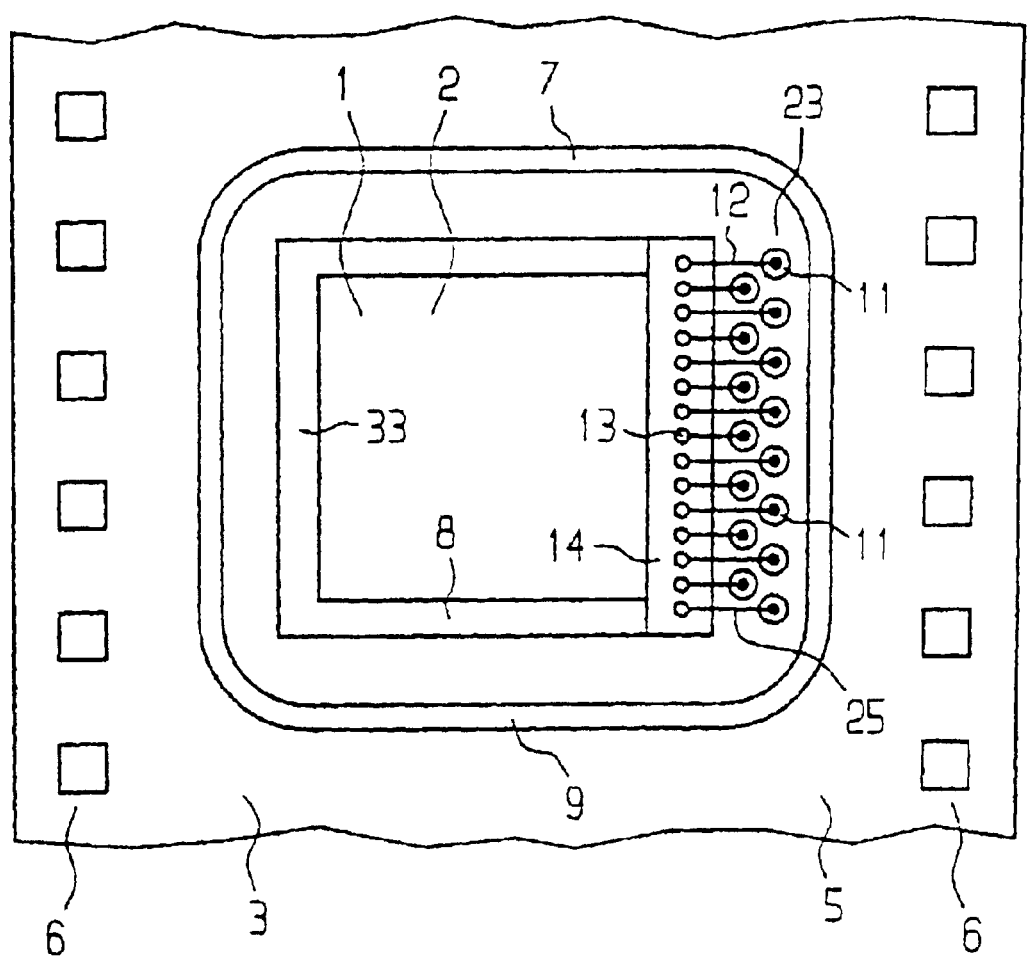

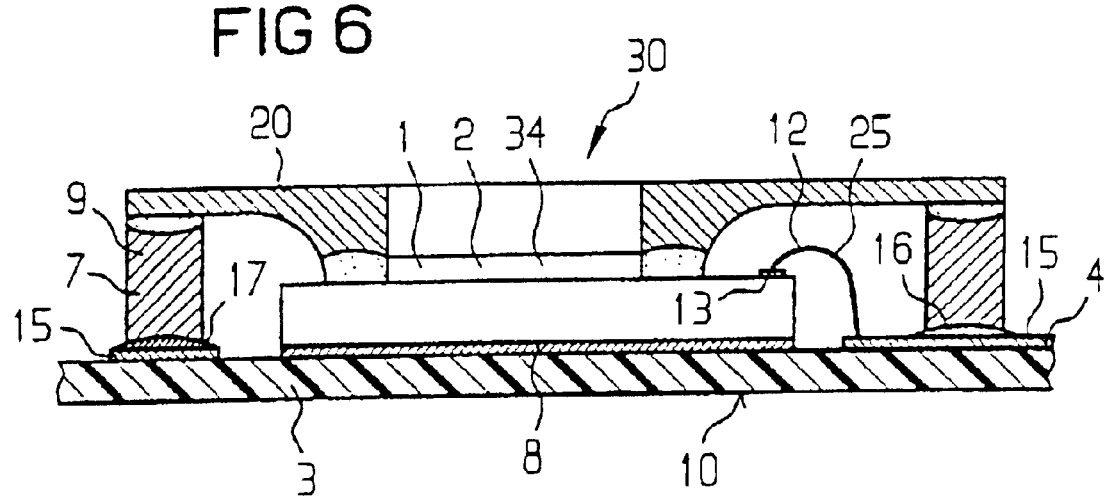
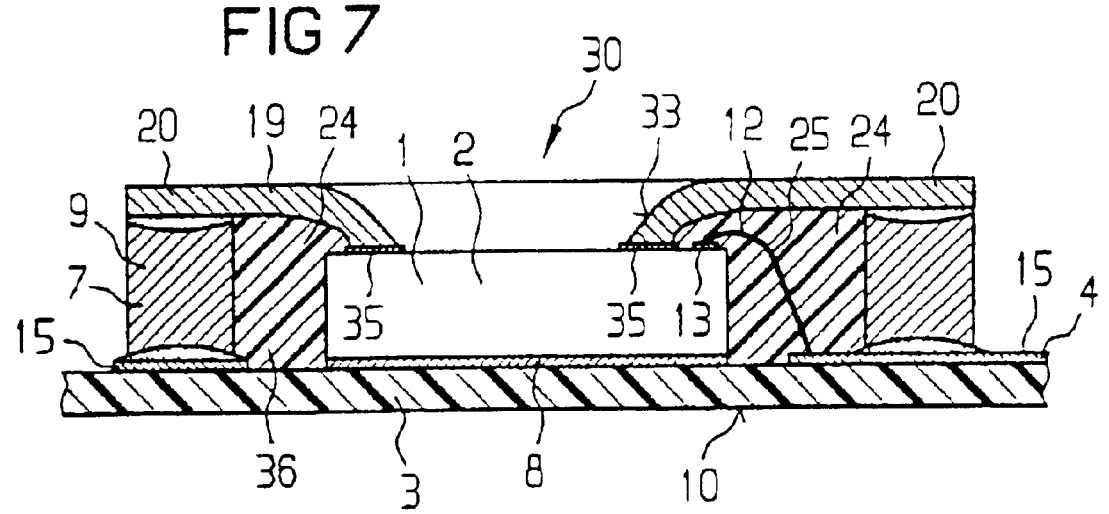

HOUSING FOR BIOMETRIC SENSOR CHIPS AND METHOD FOR PRODUCING THE HOUSING

CROSS-REFERENCE TO RELATED APPLICATION

This application is a continuation of copending International Application No. PCT/DE01/01095, filed Mar. 22, 2001, which designated the United States and was not published in English.

BACKGROUND OF THE INVENTION

Field of the Invention

The invention relates to a housing for biometric sensor chips.

Biometric sensor chips are being increasingly used for identity recognition, for example, for cash dispensers, for stocks and shares and/or for capital transfers through electronic media, or for recognizing access authorizations to bank accounts and databanks or else to other data records that are dependent on access authorizations. For such a purpose, in contrast to housings for microelectronic standard semiconductor chips, the housing for biometric sensor chips must have an area in which a fingerprint checking area of the biometric sensor chip is freely accessible. On the other hand, it is necessary to prevent the sensor chip from being destroyed, for example, as a result of electrostatic charging of a fingertip, as a result of a spark discharge when the fingerprint checking area is touched. Such a configuration should advantageously allow automatic mass production in a cost-effective manner based upon the rising demand for such housings with biometric sensor chips.

SUMMARY OF THE INVENTION

It is accordingly an object of the invention to provide a housing for biometric sensor chips that overcomes the hereinafore-mentioned disadvantages of the heretofore-known devices and methods of this general type and that, for appliances and systems in which access is controlled by a pin number, such as cash dispensers, mobile telephones, and computers, provides such a housing for biometric sensor chips, in which the active structure of the sensor chip points outward on the appliance or system so that the operator can place a finger directly on the sensor chip, and to provide an economic manufacturing method for fitting such housings for biometric sensor chips.

With the foregoing and other objects in view, there is provided, in accordance with the invention, a housing for chips, including at least one biometric sensor chip having a freely accessible fingerprint checking area and a ground contact surface, a mount substrate having contact outer surfaces, the mount substrate being a mounting strip with perforated edges, a housing frame disposed at the mount substrate, the contact outer surfaces being disposed on the mount substrate partially outside the housing frame, the sensor chip disposed within the housing frame, and the ground contact surface of the sensor chip being connected to the housing frame to form a ground frame.

A housing according to the invention for biometric sensor chips includes a freely accessible fingerprint checking area on the sensor chip, a mount substrate, and an outer contact surface on the mount substrate and has the advantage that it can be manufactured in large quantities using simple technology on a mount substrate that forms a mounting strip with perforated edges. The outer contacts can be disposed partially outside a housing frame on the mounting strip, and the sensor chip may be positioned within the housing frame. To protect the sensor chip, the housing frame is electrically connected to a ground contact surface of the sensor chip in order to form a ground frame that, like a lightning conductor, dissipates electrostatic charges on a fingertip away from the sensitive fingerprint checking area so that the electrostatic charge can be discharged through the ground frame without endangering the sensor chip.

For such a purpose, the housing frame is preferably produced from an electrically conductive material, or is at least coated with an electrically conductive material. The electrically conductive bushings for the outer contacts to the interior, which is surrounded by the housing frame, are electrically insulated from the housing frame so that it is impossible for a short circuit to occur between the outer contacts through the housing frame. The outer contacts may be disposed on the upper face of the mount substrate, which is also fitted with the sensor chip, or on the opposite lower face of the mount substrate.

In accordance with another feature of the invention, if the outer contacts are disposed in a preferred manner on the lower face of the mount substrate, then they are connected through bonding openings in the mount substrate and bonding wires to the contact surfaces of the sensor chip, which is disposed on the upper face of the mount substrate.

In accordance with a further feature of the invention, if the outer contacts are disposed in a preferred manner on the upper face of the mount substrate, on which the sensor chip is also provided, then bonded wires can advantageously be connected between the contact surfaces on the sensor chip through contact connecting surfaces of the contact outer surfaces, directly without any bonding openings in the mount substrate.

In accordance with an added feature of the invention, the mount substrate has a chip side, the sensor chip is connected to the chip side, and the contact outer surfaces are disposed on the chip side.

In accordance with an additional feature of the invention, the contact surfaces of the sensor chip and the contact outer surfaces of the mount substrate are disposed on an edge of the sensor chip or of the mount substrate so that short and uniformly spaced bonding connections are possible by bonding wires, and so that bonding of the sensor chips, which are installed in advance on the mount substrate, and of the associated contact outer surfaces can be carried out quickly, easily and uniformly because all the bonding connections have the same shape and the same length.

In accordance with yet another feature of the invention, the contact outer surfaces are located along one of the perforated edges of the mounting strip. Such a housing configuration makes it possible to use epoxy mounting strips, such as those that can also be used for smart card module manufacture. The mounting of the components together with the housing according to the invention into corresponding end appliances and end systems can be carried out as an SMT mounting process or, universally, with a flexible circuit fitting for making contact through connectors. The perforation in the edges of the mounting strip may for such a purpose be provided with a standard perforation in which, in one preferred development of the invention, the ground contact surface of the sensor chip is electrically connected to the housing frame through a structured metal coating on the mounting strip so that a grounded ground frame can be produced, which, at the same time, grounds the sensor chip.

In accordance with yet a further feature of the invention, the structured metal coating of the mounting strip can be produced by structuring of metal plating on the mounting strip. During such structuring process, the ground contact connections between the housing frame and the sensor chip and the connections for the outer contact surfaces can be prepared at the same time. For such a purpose, the structured metal coating preferably has contact outer surfaces that lead from the inside of the housing frame to the outside of the housing frame, are provided with bonding wires within the housing frame, and are freely accessible for further plug connections outside the housing frame.

In accordance with yet an added feature of the invention, the mounting strip has a structured metal coating of an insulating material and the sensor chip has a ground contact surface electrically connected to the housing frame through the structured metal coating.

To prevent a short circuit between the contact outer surfaces, the electrically conductive housing frame is mounted on the substrate mount in the area of the contact outer surfaces by an insulating adhesive, and, in the rest of the area of the substrate mount, is electrically connected to the ground contact surface of the sensor chip through a conductive adhesive. This variation in the type of adhesive allows all the areas of the housing frame to be fixed on the differently structured metal coating of the mount substrate.

In accordance with yet an additional feature of the invention, housing frame may substantially form a ground protection ring around the sensor chip or, at the same time, can be prepared for further mounting in an appliance or system. For such a purpose, the housing frame is formed from a ground frame with mounting openings, with the ground frame being fitted over a sufficiently wide area and in a sufficiently robust manner around the sensor chip so that, without needing to mechanically load the sensor chip, the ground frame can be screwed to an end appliance or an end system through the mounting openings, in an advantageous manner.

In accordance with again another feature of the invention, to further improve the safety for the sensor chip, it may preferably be covered by a conductive additional cover outside the fingerprint checking areas. The additional cover bridges the gap between the edges of the sensor chip and the ground frame. In a further preferred embodiment of the invention, the fingerprinting surface on the sensor chip may have a metal coating that is in the form of a frame and can preferably be connected to ground through the additional cover so that, outside the fingerprint checking area, the sensor chip is protected by a covering ground cover.

In accordance with again a further feature of the invention, both functions of the housing, namely of providing a housing frame as ground frame and of forming a ground cover, can preferably be carried out by a single deep-drawn or thermoformed part. A deep-drawn or thermoformed part such as this is placed over the sensor chip like a cup or a dish, which has no bottom so that the fingerprint checking area remains free in the open bottom area of the cup or dish.

In accordance with again an added feature of the invention, the mounting strip and/or ground frame of the housing may have the energy storage capacitors that are required for operation of the sensor chip, which, protected by the mounting strip and/or by the housing frame, are, thus, available for mounting in an appliance or system.

In accordance with again an additional feature of the invention, the mounting strip may be in the form of an endless strip, and may be composed of a polyimide film. In further preferred embodiments, the mount substrate is also produced from epoxy resin or is composed of a flexible polymer. This has the advantage that the sensor chips can be mounted and tested with the housing fitted in endless strips or blanks, and that the module mounting process can now be carried out in assembly lines that can also be used for smart card modules. Furthermore, the housing that is mounted on endless strips allows installation of the sensors to be easily integrated in the production process for the end appliances and end systems so that the installation process can accordingly be carried out cost-effectively.

In accordance with still another feature of the invention, the flexible circuits of the housings for the end appliances and end systems can be connected through plug connections such as zero-force connectors or through a soldered joint so that the connection technology to the housing according to the invention can be matched completely to the customer-specific production process. This also applies to the width, length, and shape of the connections on the substrate mount. The various variants of the ground frame mentioned above may be configured differently within the scope of the invention so that the ground frame is either in the form of a molding on the frame using a conductive fixed cover or is mounted in an electrically conductive manner to the frame or to the ground connection. However, the ground frame may also be fitted to the sensor chip by a conductive sheet or conductive covering compound. In this case, contact can be made with the ground connection of the sensor chip through the frame.

In accordance with still a further feature of the invention, the contact outer surfaces are disposed on the mount substrate partially inside the housing frame.

With the objects of the invention in view, there is also provided a housing for biometric sensor chips each having a ground contact surface, including a mount substrate being formed as a mounting strip with perforated edges, a housing frame disposed at the mount substrate for receiving at least one biometric sensor chip therein and defining a freely accessible fingerprint checking area for direct access by a user to the at least one biometric sensor chip, the mount substrate having contact outer surfaces disposed thereon partially outside the housing frame, and the housing frame is to be electrically connected to the ground contact surface of the at least one biometric sensor chip to form a ground frame.

The housing according to the invention is distinguished by a simple construction on an epoxy mount, on which the sensor chip can be offered to the customer in a manner that is advantageous for further processing. The special features, which are provided by the externally accessible active surface of a biometric sensor housing and the ground frame with the invention, simplify the production of the end appliances and end systems.

With the objects of the invention in view, there is also provided a method for producing a biometric sensor housing, including the steps of providing a housing frame and at least one sensor chip having contact surfaces and a ground contact surface forming a lower face of the sensor chip, structuring a metal coating on a mount substrate to form ground connecting surfaces in an area of the sensor chip, ground connecting surfaces in an area of the housing frame, and contact outer surfaces, perforating edges of the mount substrate, fitting the ground contact surface of the sensor chip onto the structured metal coating in the area of the ground connecting surfaces for the sensor chip, bonding the contact surfaces on the sensor chip to the contact outer surfaces on the mount substrate, fitting the housing frame onto the structured metal coating in the area of the ground connecting surfaces for the housing frame, and selectively sealing the bonded connections with a plastic encapsulation compound to produce a biometric sensor housing having at least one sensor chip and a freely accessible fingerprint checking area on the sensor chip.

Such a method has the advantage that it is suitable for mass production of housings for biometric sensor chips and allows immediate further processing of the housings with biometric sensor chips for production of cash dispensers, mobile telephones, and/or computers, access to which is allowed through a fingerprint.

In accordance with still an added mode of the invention, the sensor surface that is not used for fingerprint checking is covered by a housing cover, preferably, after the sealing step. Such a housing cover advantageously seals the edge area of the sensor chip hermetically against external influences so that only the fingerprint checking area remains freely accessible.

In accordance with still an additional mode of the invention, a sensor chip is provided having a ground contact surface in the form of a frame on the upper face of the sensor chip so that not only is it possible for the lower face of the sensor chip to be connected to ground, but an additional ground contact surface is also provided on the upper face of the sensor chip, in order to be short-circuited into the ground frame of the housing. Such a configuration has the advantage that it provides a relatively high degree of confidence that electrostatic discharges can be kept away from the central exposed fingerprint checking area. At the same time, the configuration also makes it possible to increase the life of the sensor chip in the housing according to the invention.

For such a purpose, the surface that is not used for fingerprint checking is preferably provided with an electrically conductive housing additional cover, which is connected to the ground contact connection on the upper face of the sensor chip. The entire housing including the cover thus forms protection, at ground potential, for the sensitive fingerprint checking area of the sensor chip. The cavities that are formed between the housing frame and the housing additional cover are, in accordance with another mode of the invention, filled with filler composed of plastic. Such a configuration has the advantage of making it possible to considerably increase the vibration resistance of the housing.

In accordance with a further mode of the invention, the metal coating on the mount substrate is structured by laser erosion. In such a variant, the mounting strip and the metal coating located on it can be tailor-made precisely and quickly in accordance with the requirements for the housing for a biometric sensor, using a continuous flow method.

In accordance with an added mode of the invention, the metal coating is structured by a photolithographic method. To perform such structuring, a photosensitive layer is applied to the metal coating of the mount substrate and the layer is, then, partially cured in an exposure step so that, in a further development step, the unexposed points can be dissolved away, and the metal of the coating located underneath can be removed by an etching process. Finally, the photoresist layer is removed from the remaining metal, preferably, by plasma incineration or ion bombardment. The application of a structuring protective layer over the metal layer for etching a structure may preferably also be achieved by a stencil-printing method or by a screen-printing method.

In accordance with a concomitant feature of the invention, the housing frame is preferably mounted on the substrate mount by an adhesive bonding technique, with the adhesive being applied in an electrically conductive or electrically insulating manner to the mount substrate or to the metal coating, respectively. Where the structured metal coating produces a short circuit to the ground contact surface of the sensor chip, an electrically conductive adhesive is used for mounting of the housing frame, in conjunction with the ground connection, to produce a ground frame for protection of the fingerprint checking area of the sensor chip. A soldering method is preferably also used as an electrically conductive connection between the ground frame and the metal coating on the mount substrate, in which soldering method a low melting point solder coating is additionally applied to the metal coating in the area of the housing frame on the mount substrate.

Other features that are considered as characteristic for the invention are set forth in the appended claims.

Although the invention is illustrated and described herein as embodied in a housing for biometric sensor chips, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a fragmentary, cross-sectional view of a housing for biometric sensor chips according to a first embodiment of the invention;

FIG. 2 is a fragmentary, plan view of the housing with the sensor chip of FIG. 1;

FIG. 3 is a fragmentary, plan view of a mounting strip with a plurality of the housings of FIG. 1;

FIG. 4 is a fragmentary, cross-sectional view of a housing for biometric sensor chips according to a second embodiment of the invention;

FIG. 5 is a fragmentary, plan view of the housing with the sensor chip of FIG. 4;

FIG. 6 is a fragmentary, cross-sectional view of a housing for biometric sensor chips according to a third embodiment of the invention;

FIG. 7 is a fragmentary, cross-sectional view of a housing for biometric sensor chips according to a fourth embodiment of the invention;

DESCRIPTION OF THE PREFERRED EMBODIMENTS

Figure 8:
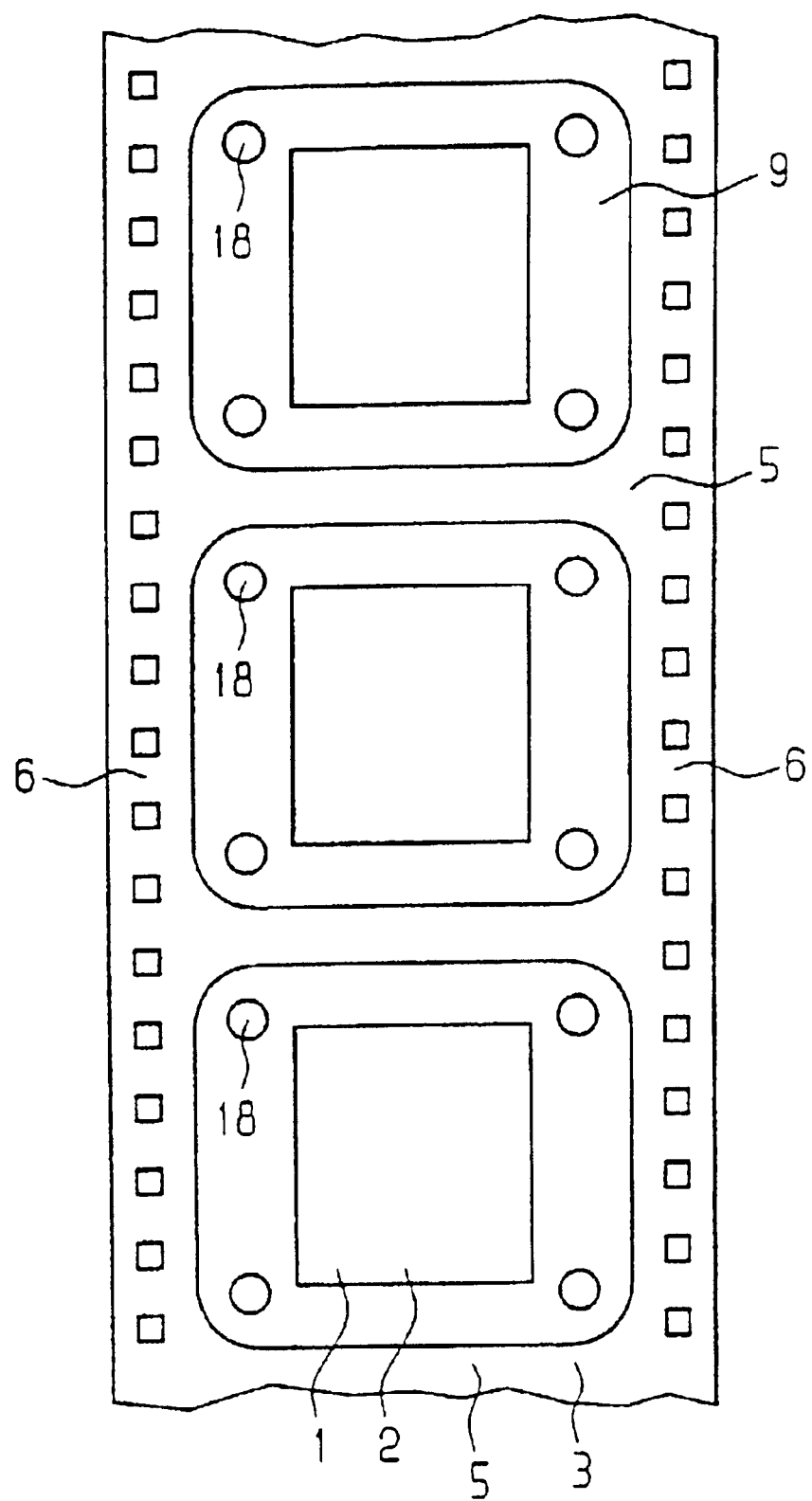
FIG. 8 is a fragmentary, plan view of a mounting strip with a plurality of the housings of FIG. 7.

Referring now to the figures of the drawings in detail and first, particularly to FIG. 1 thereof, there is shown a basic cross-sectional view of a housing 30 for biometric sensor chips 1 according to a first embodiment of the invention. The housing leaves free a freely accessible fingerprint checking area 2 on the sensor chip 1 so that a user can allow his fingertip to be checked in order to check for access authorization to correspondingly secured appliances and services, as well as systems and objects. The sensor chip is disposed in a housing frame 7, which is open at the top and is located on a metal coating 15, to which it is electrically connected through a conductive adhesive 17. The sensor chip 1 is mounted on the same metal coating 15, preferably, using a conductive adhesive, with its ground contact surface 8 on the lower face of the sensor chip 1, and is electrically connected through a metallic conductor 28 to the housing frame 7 so that a ground frame 9 is formed that protects the sensor chip against electrical discharge.

A ground frame so constructed at the same time advantageously lengthens the life of the sensor chip because fingertips frequently carry strong electrostatic charges, which charges form spark discharges can destroy the sensor chip. However, such spark discharges are dissipated through the ground frame 7 in the housing according to the invention. The metal layer 15 of the mount substrate 3 is structured and, in the area of the bonding connection 25, has contact outer surfaces 4 that are electrically connected through bonding wires 12 to contact surfaces 13 on the chip 1. The housing frame 7, which is composed of a conductive material or of a metal-coated non-conductor, is, in this exemplary embodiment, connected to the mount substrate 3 by an insulating adhesive 16 in the area of the contact outer surfaces 4. The adhesive bead 16 on the housing frame 7 in the area of the contact outer surfaces 4 is composed of an insulating adhesive. Such a configuration ensures that the contact outer surfaces are not short-circuited.

The bonding connections 25 are protected against mechanical damage by a plastic encapsulation compound so that an edge area within the housing frame 7 is completely filled with plastic encapsulation compound 24. The mount substrate 3 is a mounting strip that is perforated at the edges 6, as can clearly be seen in the plan view in FIG. 2. The plastic encapsulation compound 24 is omitted in the plan view of FIG. 2, or is indicated by a dashed line to make it possible to show the configuration of the contact surfaces 13 on the sensor chip 1, and to show the configuration of the bonding connections 25 in the connecting area 23 of the housing for biometric sensor chips 1. In the exemplary embodiment, the contact outer surfaces lie in a row parallel to the perforation of the mounting strip 5. The metallic frame 7 surrounds the sensor chip 1 with a predetermined gap and, as mentioned above, is connected to the ground contact surface 8 of the sensor chip 1, as is shown in FIG. 1, through the structured metal coating 15.

FIG. 3 shows a plan view of a mounting strip 5 with a number of housings 30 as shown in FIG. 1. The mounting strip 5, which is perforated at the edges 6, allows the mount substrate 3 to be moved continuously and progressively in an automated manner from one processing station to the next so that the process of assembling the housing with the sensor chip and the bonding of the connections can be carried out quickly and economically. In such an embodiment, an epoxy mounting strip is used for such a purpose, such as that which may also be used for smart card module manufacture. Standardized strips may, therefore, be used, thus reducing the production costs further.

Furthermore, the strip can be delivered in such a form to the appliance manufacturers who are carrying out the further processing. It can clearly be seen in FIG. 3 that the fingerprint checking area is freely accessible and only the cover area 14 is not available for the fingerprint checking area because the different bonding connections for the contact outer surfaces 4 are disposed in the edge area 23. Energy storage capacitors 40 are diagrammatically illustrated mounted on the mounting strip 5.

FIG. 4 shows a basic cross-sectional view of a housing for biometric sensor chips according to a second embodiment of the invention. In FIG. 1, the contact outer surfaces 4 are disposed on the sensor chip side of the mount substrate 3. In FIG. 4, the outer contact surfaces 4 in the second embodiment are disposed on the lower face of the mounting strip, as can be seen in the cross-section in FIG. 4. The metal layer 32 that is applied there bridges bonding openings 11 in the mount substrate 3, through which bonding wires 12 are connected to the metal coating 32. These bonding wires 12 connect the contact surfaces 13 on the semiconductor chip 1 to the outer contact surfaces 4 on the lower face 10 of the mount substrate 3 in this embodiment.

In contrast to the exemplary embodiment shown in FIG. 1, the housing frame 7 in the exemplary embodiment shown in FIG. 4 may be mounted continuously on the metal coating of the substrate mount 3 using a conductive adhesive. The second embodiment has the advantage that the metal coating 15 of the substrate mount 3 need not be structured so that it is possible to save a complex method step, namely, that of structuring the metal coating 15.

FIG. 5 shows a plan view of the housing 30 shown in FIG. 4. In addition to the row of contact surfaces 13 at the edge of the sensor chip 1, the plan view of FIG. 5 shows a ground contact surface 33, in the form of a frame, in the edge area of the surface of the sensor chip 1. The ground contact surface 33, which is in the form of a frame, additionally increases the reliability of the sensor chip and, in one preferred embodiment of the invention, is electrically connected to the housing frame 7. FIG. 5 also shows that the coating of the mounting strip 5 may be continuous because a hole through to the lower face of the mounting strip is available for each of the bonding connections, and the contact outer surfaces 4 are disposed on the lower face. The metal coating of the mounting strip need not be structured in this embodiment, although bonding holes must be provided at a suitable point for such a purpose. Furthermore, this embodiment of the invention allows the ground frame 7 to be fixed directly and in a closed manner on the metal coating of the mounting strip, using a conductive adhesive 17 or using a solder joint.

FIG. 6 shows a basic cross-sectional view of a housing 30 for biometric sensor chips 1 according to a third embodiment of the invention. In the third embodiment, the housing 30 includes a housing frame 7 that is mounted on the metal coating 15 by a conductive adhesive 17, and is fixed in the area of the contact outer surfaces 4 by an insulating adhesive 16. As an alternative to the embodiments shown in FIGS. 1 to 5, a ground and housing cover 20 is also disposed above the sensor chip 1 in the embodiment of FIG. 6, now leaving free only the fingerprint checking area 2. The cavity between the housing frame 7 and the fingerprint checking area 2 is provided with a hermetic seal by an additional seal 34. The cover 20 may be soldered to the housing frame 7 so that the cover 20 and the housing frame 7 form a ground housing, which protects the sensor chip not only mechanically but also electrically.

FIG. 7 shows a basic cross-sectional view of a housing 30 for biometric sensor chips 1 according to a fourth embodiment of the invention. The fourth embodiment has two improvements over the embodiment of FIG. 6. Firstly, the electrically conductive additional cover 19 makes direct contact with a ground contact surface 33 that is in the form of a frame and is disposed on the semiconductor chip 1 so that a ground cover 20 surrounds the fingerprint checking area 2. Furthermore, the cavities between the conductive cover and the conductive housing frame are filled with a filler 36, which improves the robustness and the vibration resistance of the housing with the biometric sensor chip 1.

FIG. 8 shows a plan view of a number of the housings shown in FIG. 7, with the fingerprint checking area 2 being shown with a ground edge and an additional cover, and the ground frame 9 additionally having mounting openings 18, which allow the housing to be mounted on an end appliance or end system using a simple screw technique.

Figure 9:
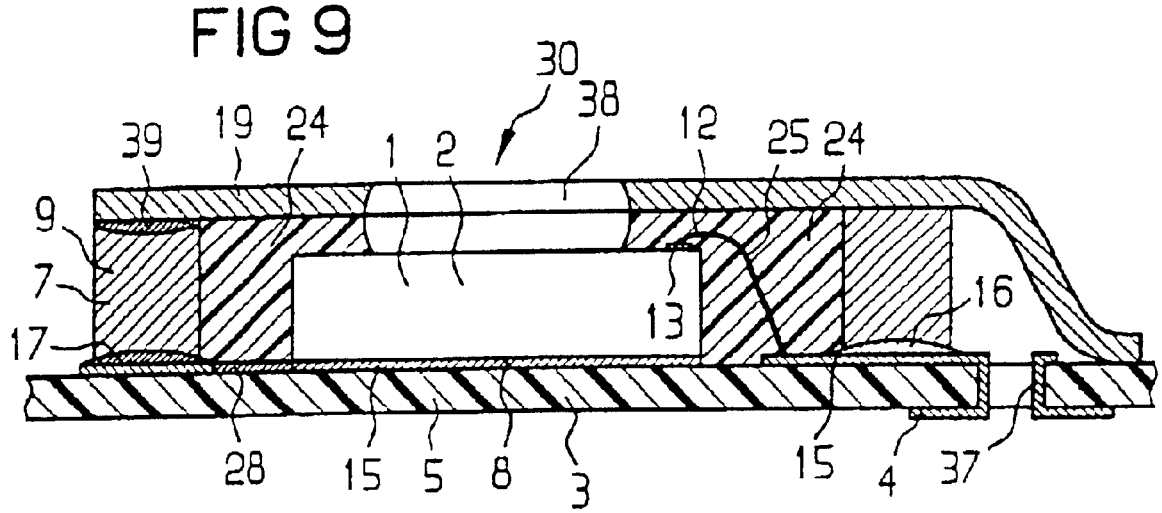
FIG. 9 is a fragmentary, cross-sectional view of a housing for biometric sensor chips according to a fifth embodiment of the invention.

FIG. 9 shows a basic cross-sectional view of a housing 30 for biometric sensor chips 1 according to a fifth embodiment of the invention. In the fifth embodiment of the invention, a cover 19 that is electrically conductive can, once again, be seen, but the cover 19 is passed over the sensor chip 1, with a central opening 38 being provided for access to the fingerprint checking area 2. In this embodiment, the sensor chip 1 does not have a ground contact surface in the form of a frame on its surface, as in FIG. 7, and the intermediate space between the housing frame and the housing cover and sensor chip is filled with filler. The ground contact surface 8 is connected to the cover 19 through the structured metal coating 15 on the mount substrate 3, the conductive adhesive 17, the housing frame 7, and the conductive adhesive 39, with the ground contact surface 8 of the sensor chip 1 being connected to the housing frame 7 through the connecting line 28 of the metal coating 15. A further difference between the fifth embodiment, which is illustrated here, and the previously described embodiments can be seen in the through-contact 37, which produces the outer contact connection to the outer contact surface 4, which is disposed on the lower face of the mount substrate 3.

Figure 10:
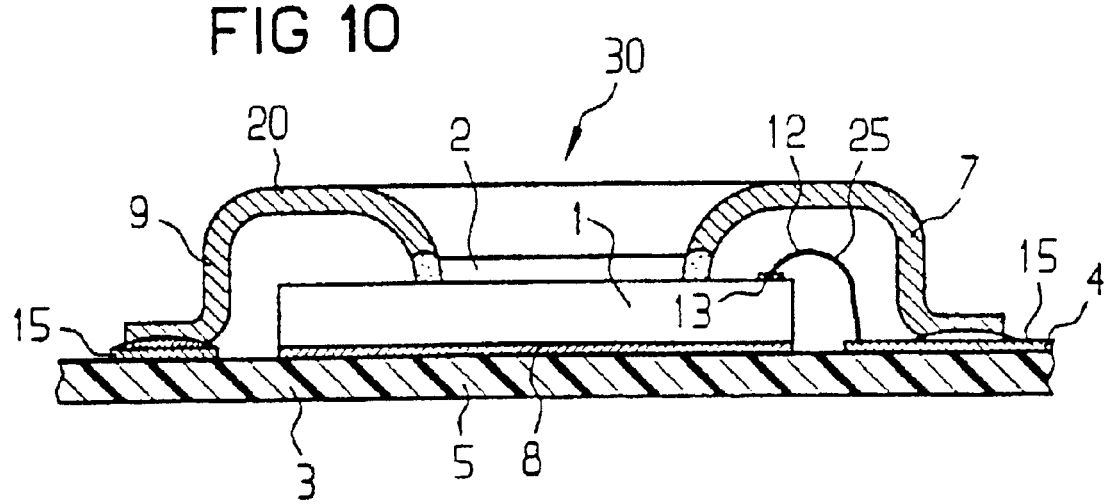
FIG. 10 is a fragmentary, cross-sectional view of a housing for biometric sensor chips according to a sixth embodiment of the invention.

FIG. 10. shows a basic cross-sectional view of a housing 30 for biometric sensor chips 1 according to a sixth embodiment of the invention. In the sixth embodiment, the housing cover 9 and the housing frame 7 form an integral deep-drawn or thermoformed part, which is placed over the sensor chip 1 like a pot. The embodiment of FIG. 10 has the advantage that the assembly process is greatly simplified because fewer components need to be prepared and, on the other hand, it has the advantage that housings for sensor chips can be mass-produced at low cost in a relatively simple way.

We claim:

1. A housing for chips, comprising:
at least one biometric sensor chip having a freely accessible fingerprint checking area and a ground contact surface;
a mount substrate having contact outer surfaces;
a housing frame disposed at said mount substrate;
said contact outer surfaces being disposed on said mount substrate partially outside said housing frame;
said sensor chip disposed within said housing frame; and
said ground contact surface of said sensor chip being connected to said housing frame to form a ground frame.

2. The housing according to claim 1, wherein:
said sensor chip has contact surfaces;
said mount substrate has a lower face;
said mount substrate has bonding openings;
said contact outer surfaces are disposed on said lower face and
bonding wires connect said contact outer surfaces to said contact surfaces on said sensor chip through said bonding openings.

3. The housing according to claim 1, wherein:
said mount substrate has a chip side;
said sensor chip is connected to said chip side; and
said contact outer surfaces are disposed on said chip side.

4. The housing according to claim 1, wherein:
said sensor chip has contact surfaces;
one of said sensor chip and said mount substrate has an edge pointing to one of said perforated edges; and
one of said contact surfaces and said contact outer surfaces are disposed on said edge pointing to said one of said perforated edges.

5. The housing according to claim 1, wherein:
said sensor chip has contact surfaces;
said sensor chip and said mount substrate each have an edge pointing to one of said perforated edges; and
said contact surfaces and said contact outer surfaces are respectively disposed on said edge pointing to said one of said perforated edges.

6. The housing according to claim 1, wherein:
said mounting strip has a structured metal coating of an insulating material; and
said sensor chip has a ground contact surface electrically connected to said housing frame through said structured metal coating.

7. The housing according to claim 6, wherein:
said housing frame has an inside face;
said structured metal coating has contact outer surfaces leading from said inside face to outside said housing frame;
a portion of said contact outer surfaces are within said housing frame;
bonding wires are connected to said contact outer surfaces within said housing frame; and
said contact outer surfaces are freely accessible outside the housing frame.

8. The housing according to claim 6, wherein:
an insulating adhesive mounts said housing frame on said substrate mount in an area of said contact outer surfaces; and
a conductive adhesive and a metal coating electrically connect said housing frame to said ground contact surface of the sensor chip in areas other than said area of said contact outer surfaces of said substrate mount.

9. The housing according to claim 7, wherein:
an insulating adhesive mounts said housing frame on said substrate mount in an area of said contact outer surfaces; and
a conductive adhesive and a metal coating electrically connect said housing frame to said ground contact surface of the sensor chip in areas other than said area of said contact outer surfaces of said substrate mount.

10. The housing according to claim 1, wherein said housing frame is formed from a ground frame with mounting openings.

11. The housing according to claim 1, including an additional cover covering said sensor chip outside said fingerprint checking area.

12. The housing according to claim 1, including a ground cover covering areas outside said fingerprint checking area.

13. The housing according to claim 1, including a ground cover covering areas of said sensor chip outside said fingerprint checking area.

14. The housing according to claim 1, wherein said housing cover and said housing frame are one of an integrally deep-drawn part and an integrally thermoformed part having said ground frame and a ground cover.

15. The housing according to claim 1, including energy storage capacitors mounted on said mounting strip.

16. The housing according to claim 1, wherein said mount substrate is an endless strip.

17. The housing according to claim 1, wherein said mount substrate is of epoxy resin.

18. The apparatus according to claim 1, wherein said mount substrate is flexible and is of a polymer.

19. The housing according to claim 1, wherein said contact outer surfaces are disposed on said mount substrate partially inside said housing frame.

20. The housing according to claim 1, wherein said mount substrate is a mounting strip with perforated edges.

* * * * *